United States Patent [19]

Fujii et al.

[11] 4,297,655
[45] Oct. 27, 1981

[54] TEMPERATURE COMPENSATED CRYSTAL OSCILLATOR

[75] Inventors: Shuzo Fujii; Yoshikatsu Sato, both of Tokyo, Japan

[73] Assignee: Nippon Electric Co., Ltd., Tokyo, Japan

[21] Appl. No.: 84,693

[22] Filed: Oct. 15, 1979

[30] Foreign Application Priority Data

Oct. 20, 1978 [JP] Japan ............................... 53-129260
Dec. 15, 1978 [JP] Japan ............................... 53-156128

[51] Int. Cl.³ .......................... H03B 5/04; H03B 5/36
[52] U.S. Cl. .................................... 331/116 R; 331/176
[58] Field of Search .................. 331/116 R, 176, 66

[56] References Cited

U.S. PATENT DOCUMENTS 3,322,981 5/1967 Brenig ............................ 331/176 X
3,525,055 8/1970 Mrozek .......................... 331/176 X

FOREIGN PATENT DOCUMENTS 1252760 10/1967 Fed. Rep. of Germany ...... 331/176
2101293 7/1971 Fed. Rep. of Germany ...... 331/176

*Primary Examiner*—Siegfried H. Grimm
*Attorney, Agent, or Firm*—Sughrue, Mion, Zinn, Macpeak & Seas

[57] ABSTRACT

A temperature compensated crystal oscillator having a crystal resonator uses a single thermistor and no expensive varactor. The compensation circuit includes, a low temperature compensation circuit consisting of a first fixed capacitor and a first diode in series, a high temperature compensation circuit consisting of a second fixed capacitor and a second diode in series, and an intermediate temperature compensating circuit consisting of a third capacitor having a negative temperature coefficient. All three circuits are in parallel with each other and in series with the crystal resonator of the oscillator. A thermistor is connected to the anodes of both diodes and biasing resistors and connected to the cathode of the second diode whereby a temperature dependent forward bias is applied to the first diode at all temperatures and to the second diode only at the high temperatures.

6 Claims, 8 Drawing Figures

TEMPERATURE COMPENSATED CRYSTAL OSCILLATOR

BACKGROUND OF THE INVENTION

The present invention relates to a temperature compensated crystal oscillator (TCXO) used for a communication system, a data processing system, and the like systems.

A TCXO which remains stable despite a change of the environmental temperature has been used to produce a reference or designated frequency in a mobile telephone system as reported in a paper entitled "800 MHz Band Land Mobile Telephone Radio System" by Terumochi Kamata et al., REVIEW OF THE ELECTRICAL COMMUNICATION LABORATORIES Volume 25, Numbers 11 to 12, December issue, 1977, pp. 1157 to 1171. Details of the construction and the operation of a TCXO is further discussed in a paper entitled "A microcircuit Temperature Compensated Crystal Oscillator (MCTCXO)" by L. Thoman, in the PROCEEDINGS OF THE 28th ANNUAL SYMPOSIUM ON FREQUENCY CONTROL 1974, pp. 214–220. Thoman's TCXO uses a temperature compensating circuit including three thermistors ($RT_1$ to $RT_3$) and a plurality of resistors ($R_A$ to $R_D$), a piezoelectric crystal resonator ($Y_3$) to determine an oscillating frequency, and varactors ($CR_2$ and $CR_3$) to change a load capacitor of the resonator. This makes the oscillator considerably complicated and costly to manufacture. The oscillator thus produced in therefore not suitable for the above-mentioned mobile telephone system, which is required to be of a simpler structure and a lower manufacturing cost.

SUMMARY OF THE INVENTION

Accordingly, one object of the invention is to provide a TCXO which is small enough and inexpensive enough to meet the above-mentioned requirements.

According to the invention, there is provided a TCXO having an oscillator section which includes a crystal resonator and an amplifying element, and a temperature compensating section for compensating for a change of an oscillating frequency due to a temperature change of the oscillator section, wherein the temperature compensating circuit comprises: a first compensating circuit for low temperature compensation including a first fixed capacitive element connected in series with the crystal resonator and a first diode; a second temperature compensating circuit for high temperature compensation including a second fixed capacitive element connected in parallel with the first compensating circuit and a second diode; bias means for applying an inverse bias voltage to the second diode in the low and intermediate temperature ranges; a third capacitor for intermediate temperature compensation connected to the first temperature compensation circuit; and a thermistor for applying a forward temperature-dependent voltage to the first and second diodes.

BRIEF DESCRIPTION OF THE DRAWINGS

For the purpose of illustrating the invention, one embodiment is shown in the drawings in which.

In drawings, like reference numerals represent like structural elements.

DETAILED DESCRIPTION OF THE PREFERRED EMBODIMENT

Figure 1:
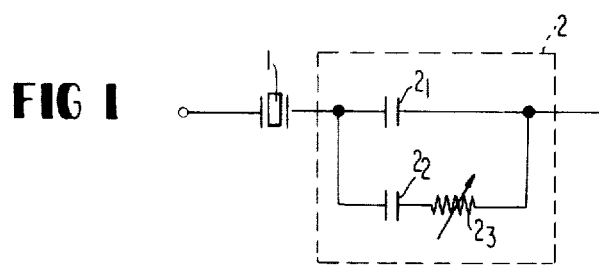
FIG. 1 shows a schematic circuit diagram for illustrating the operation principle of the present TCXO.

Referring to FIG. 1, a load capacitor 2 of a piezoelectric crystal resonator (referred to as a crystal resonator) 1 to determine an oscillating frequency of a temperature compensated crystal oscillator (TCXO) includes a first capacitor $2_1$ ($C_1$) connected serially to the crystal resonator 1, a second capacitor $2_2$ ($C_2$) connected in parallel with the first capacitor $2_1$, and a resistor $2_3$ ($R_1$) connected in series with the second capacitor $2_2$. It is to be noted that parenthesized symbols $C_1$, $C_2$, and $R_1$ represent capacitances and resistance, respectively.

The capacitance $C_L$ of the load capacitor 2 is expressed by $$C_L = \frac{R_1^2 + \frac{1}{\omega^2}\left(\frac{1}{C_1} + \frac{1}{C_2}\right)^2}{\frac{R_1^2}{C_1} + \frac{1}{\omega^2} \cdot \frac{1}{C_1 C_2}\left(\frac{1}{C_1} + \frac{1}{C_2}\right)}$$

where $\omega = 2\pi f$. When the resistance of the resistor $2_3$ varies from $R_{11}$ to $R_{12}$, the frequency deviation $\Delta f/f$ of the crystal 1 is $$\frac{\Delta f}{f} = \frac{1}{2\gamma\left(1 + \frac{C_1}{C_0}\right)} = \qquad (2)$$

$$\frac{1}{2\gamma}\left[\frac{1}{\left(1 + \frac{C_{L11}}{C_0}\right)} - \frac{1}{\left(1 + \frac{C_{L12}}{C_0}\right)}\right]$$

where $$C_{L11} = \frac{R_{11}^2 + \frac{1}{\omega^2}\left(\frac{1}{C_1} + \frac{1}{C_2}\right)^2}{\frac{R_{11}^2}{C_1} + \frac{1}{\omega^2} \cdot \frac{1}{C_1 C_2} \cdot \left(\frac{1}{C_1} + \frac{1}{C_2}\right)}$$

$$C_{L12} = \frac{R_{12}^2 + \frac{1}{\omega^2}\left(\frac{1}{C_1} + \frac{1}{C_2}\right)^2}{\frac{R_{12}^2}{C_1} + \frac{1}{\omega^2} \cdot \frac{1}{C_1 C_2} \cdot \left(\frac{1}{C_1} + \frac{1}{C_2}\right)}$$

In equation (2), $\gamma$ is the capacitance ratio of the crystal resonator 1 and the capacitance $C_0$ is the parallel capacitance of the crystal resonator 1. As is evident from equation (2), when the resistance $R_{11}$ of the resistor $2_3$ changes depending on environmental temperature (referred to as temperature hereunder), the frequency of the resonator 1 can change depending on the temperature change.

The invention is aimed at compensating the deviation in the oscillating frequency of the oscillator based on the above-mentioned operation.

Figure 2:
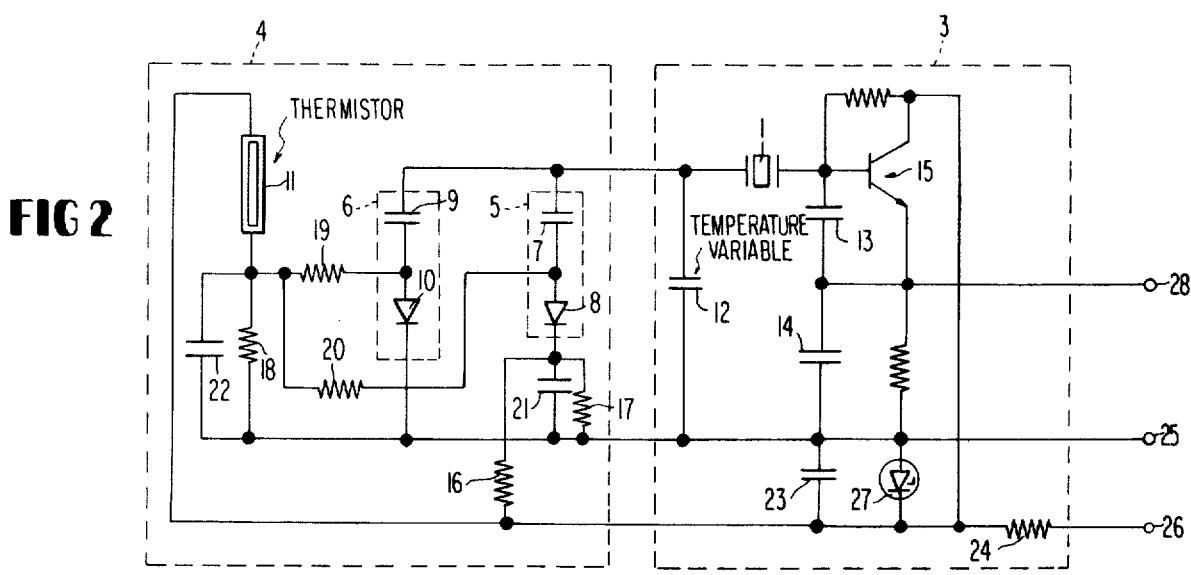
FIG. 2 shows a circuit diagram of one embodiment of the invention.

Turning now to FIG. 2, the present TCXO comprises a Collpitts type oscillator circuit 3 having crystal resonator 1 and a transistor 15 as an amplifying element, and a temperature compensating section 4 to compensate for the frequency deviation due to the temperature change of the oscillator circuit 3. The section 4 includes a high temperature compensating circuit 5 consisting of a series circuit having a capacitor 7 and a diode 8, a low temperature compensating circuit 6 consisting of a series circuit having a capacitor 9 and a diode 10, and a thermistor 11 for providing a temperature-dependent voltage to the diodes 8 and 10. The compensating circuits 5 and 6 correspond to the series circuit having the capacitor $2_2$ and the resistor $2_3$ of FIG. 1. The capacitance of the capacitor $2_1$ shown in FIG. 1. is equal to the sum of the capacitances of the capacitors 12, 13, and 14, and the junction capacitance between the base and the emitter of the transistor 15. The resistors 16 and 17, the resistors 19 and 20, and the resistor 18 are used for supplying a bias voltage to prevent the diode 8 from being conductive at low temperatures, for adjusting a voltage applied from the thermistor 11 to the diodes 8 and 10, and for dividing a voltage applied to the thermistor 11 from terminals 25 and 26, respectively. The capacitors 21 and 22 are by-pass capacitors. A combination of a capacitor 23, a resistor 24, and a Zener diode 27 is used to eliminate noise superimposed on a DC voltage applied to the terminals 25 and 26 and to stabilize the DC voltage. An oscillating output signal is taken out from the terminal 28.

Figure 3:
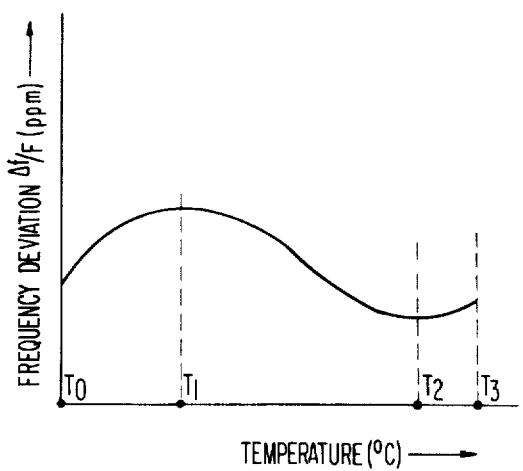
FIGS. 3 to 8 show graphs useful in describing the operation of the TCXO shown in FIG. 2.
Figure 4:
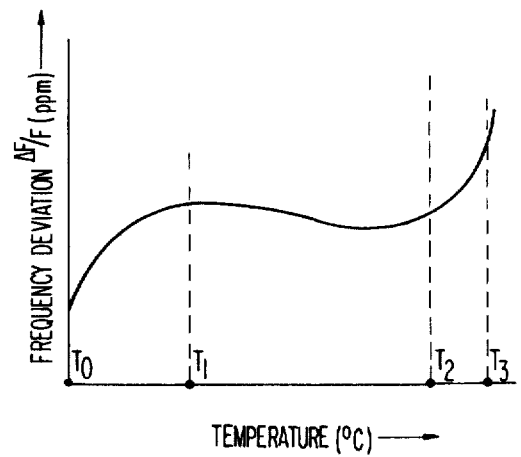

The operation of the TCXO of FIG. 2 will be described in detail with reference to FIGS. 3 to 8. The crystal resonator 1 has a frequency-temperature characteristic as shown in FIG. 3. The temperature compensation in the intermediate temperature range from $T_1$ to $T_2$, approximately 10° C. (degrees centrigrade) to 40° C. is performed by giving a negative temperature coefficient to the capacitor 12. The compensated characteristic is as shown in FIG. 4.

Figure 5:
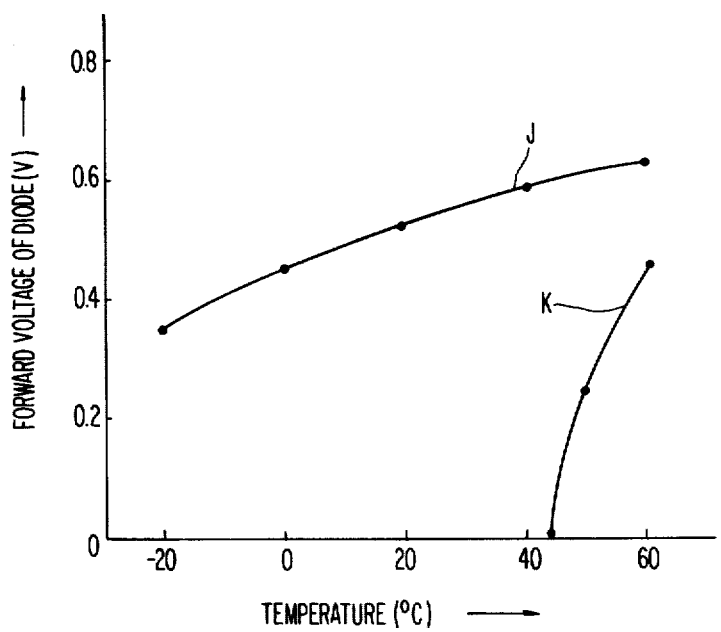
Figure 6:
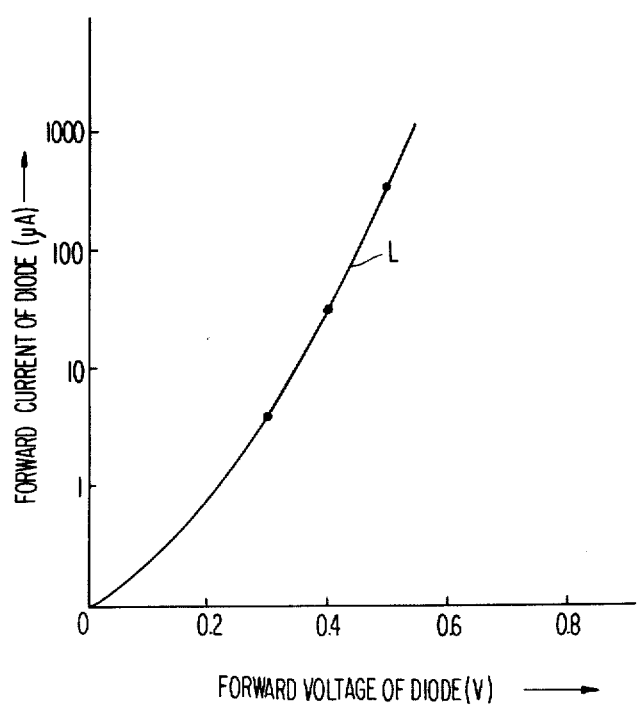
Figure 7:
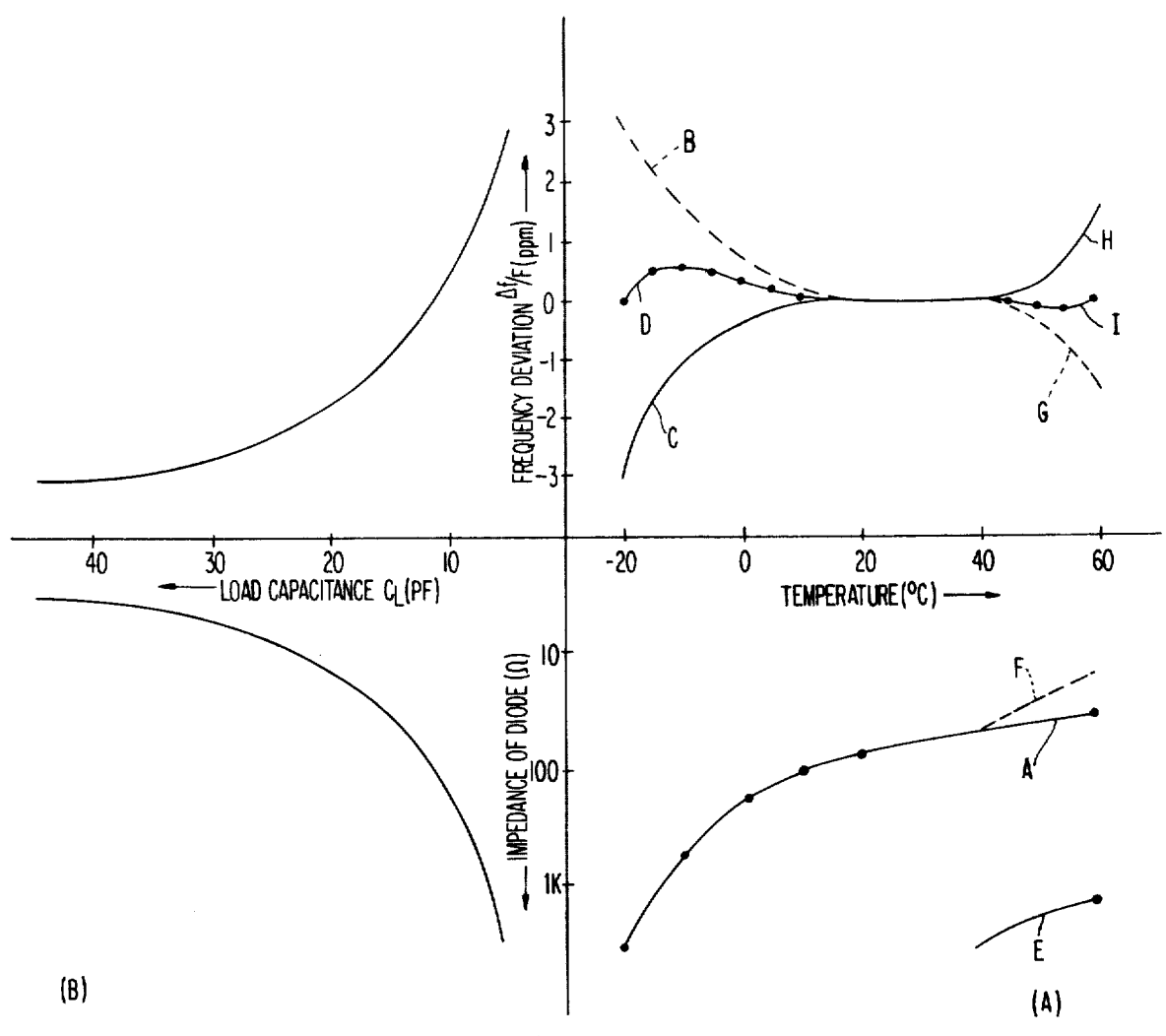

The temperature compensation in the low temperature range from $T_0$ to $T_1$ shown in FIG. 4 will be described. In the low temperature range, a voltage given through the resistors 16 and 17 to the cathode of the diode 8 is higher than a voltage applied through the resistor 20 to the anode of the diode 8. This is caused by the resistance change of the thermistor 11. As a result, the diode 8 does not assume a conductive state. Also, when the voltage given from the thermistor 11 is applied through the resistor 19 to the anode of the diode 10, the diode 10 becomes conductive because no voltage is supplied to the cathode of the diode 10. The voltage given to the diode 10 changes dependent on the temperature, so that the impedance of the diode 10 also changes depending on the temperature. The relationship between the forward voltage of the diode 10 and the temperature, and the relationship between the forward current of the diode 10 and the forward voltage of the diode 10 are illustrated by characteristic curves J and L in FIGS. 5 and 6, respectively. The relationship between the impedance of the diode 10 and the temperature, which is deduced from the characteristic curves shown in FIGS. 5 and 6, is also depicted by a characteristic curve A in FIG. 7(A). As mentioned above, the impedance of the diode 10 changes with the temperature with the result that the load capacitance $C_L$ may change with the temperature depending on equation (1). The relationship between the impedance of the diode 10 and the load capacitance $C_L$ at this time is obtained by using equation (1) and plotted as shown in FIG. 7(B). As is evident from equation (2), a change of the load capacitance $C_L$ causes the frequency deviation, and consequently the relationship between the load capacitance $C_L$ and the rate ($\Delta f/f$) of the frequency change is obtained by equation (2) and plotted as shown in FIG. 7(C). The temperature compensating characteristic in the low temperature range $T_0$ to $T_1$ obtained from the characteristic curve of FIG. 7(C) is plotted by a characteristic curve B indicated by dotted line in FIG. 7(D). A frequency characteristic curve C in FIG. 7(D) of the crystal resonator before the temperature compensation is compensated by the compensating characteristic curve B to be a characteristic curve D.

In the high temperature range from $T_2$ to $T_3$ (40° C. to 60° C.), the values of the resistors 16 and 17 are selected such that the anode voltage of the diode 8 is higher than its cathode voltage to render the diode 8 conductive. The anode voltage given to the diode 8 changes dependent on the temperature, causing a temperature-dependent change in the impedance of the diode 8.

Figure 8:
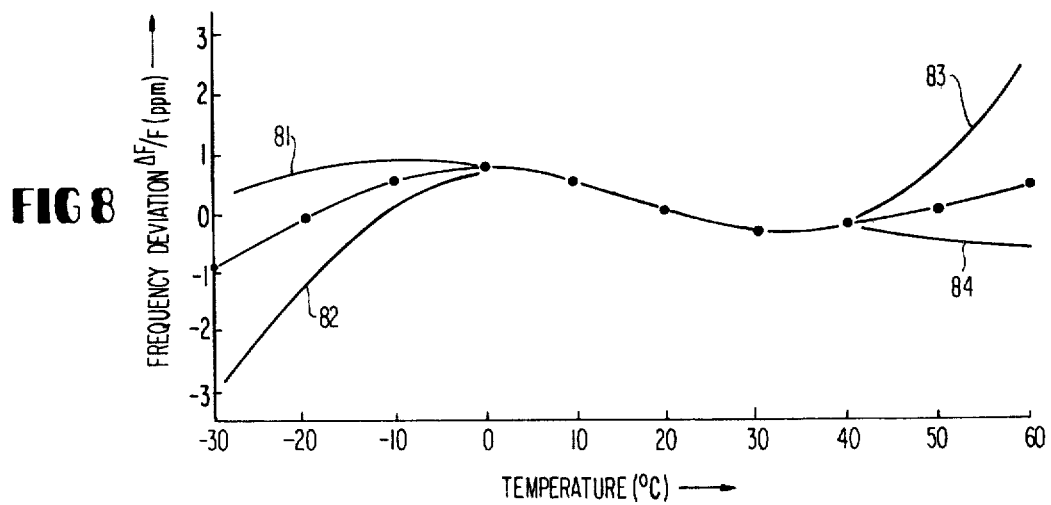

The relationship between the impedance of the diode 8 and the temperature is obtained by using a characteristic curve K shown in FIG. 5 and the characteristic curve L shown in FIG. 6, and is depicted as indicated by a characteristic curve E shown in FIG. 7(A). The diode 10 is also conductive in the temperature range of $T_1$ to $T_2$ so as to give its impedance change in the same temperature range. The relationship between the resultant impedance of the diodes 8 and 10, and temperature is expressed as indicated by a characteristic curve F in FIG. 7(A). As in the case of obtaining the temperature compensating characteristic curve in the temperature range of $T_1$ to $T_2$, a temperature compensating characteristic curve corresponding to the characteristic curve F is obtained as indicated by a characteristic curve G in FIG. 7(G). As a result, a frequency characteristic curve H shown in FIG. 7(D) of the crystal resonator in the high temperature range becomes as indicated by a characteristic curve 1 from the temperature compensating characteristic curve G. The temperature compensating characteristic curves B and G of FIG. 7(D) are changed into characteristic curves 81 to 84 as shown in FIG. 8 by adjusting the resistances of the resistors 16 to 20. A variation in compensating characteristic due to the manufacturing of the structural elements used in the oscillator may be corrected by adjusting those resistors properly.

In the embodiment mentioned above, the temperature compensation in the intermediate temperature range is conducted by using the single capacitor 12 having a negative temperature coefficient whose value is selected by the temperature characteristic of the resonator 1. However, it is clear that the capacitor 12 may be composed of two serial or parallel capacitors. When the resonator having a flat temperature characteristic in the intermediate temperature range is adopted in the present invention, the low or high temperature compensating circuit 5 or 6 may be omitted.

In this way, the present invention can provide the simple and inexpensive TCXO using a single thermistor without the expensive varactor employed in the conventional TCXO.

While various aspects of the present invention have been described and illustrated in detail, it is to be understood that the same is not by way of limitation but by way of example.

What is claimed is:

1. In a temperature compensated crystal oscillator comprising an oscillator section having a crystal resonator and an amplifying element, and a temperature compensating section for compensating for a change in the oscillator frequency due to a temperature change of said oscillator section, the improvement wherein said temperature compensating section comprises: a low temperature compensating circuit comprising a series circuit including a fixed capacitor connected in series with said crystal resonator and a diode, and a thermistor for applying a forward-bias temperature-dependent voltage to a connection point between said fixed capacitor and said diode.

2. In a temperature compensated crystal oscillator comprising an oscillator section having a crystal resonator and an amplifying element, and a temperature compensating section for compensating for a change in the oscillator frequency due to a temperature change of said oscillator section, the improvement wherein said temperature compensating section comprises: a high temperature compensating circuit comprising a series circuit including a fixed capacitor connected in series with said crystal resonator and a diode; bias means for applying an inverse bias to said diode in the low and intermediate temperature ranges; and a thermistor for applying a forward-bias temperature-dependent voltage to a connection point between said fixed capacitor and said diode.

3. In a temperature compensated crystal oscillator comprising an oscillator section having a crystal resonator and an amplifying element, and a temperature compensating section for compensating for a change in the oscillator frequency due to a temperature change of said oscillator section, the improvement wherein said temperature compensating section comprises: a low temperature compensating circuit comprising a series circuit having a first fixed capacitor connected in series with said crystal resonator and a diode; a second temperature variable capacitor for intermediate temperature compensation connected in parallel to said low temperature compensating circuit; and a thermistor for applying a forward-bias temperature-dependent voltage to a connection point between said fixed capacitor and said diode.

4. In a temperature compensated crystal oscillator comprising an oscillator section having a crystal resonator and an amplifying element, and a temperature compensating section for compensating for a change in the oscillator frequency due to a temperature change of the oscillator section, the improvement wherein said temperature compensating section comprises: a high temperature compensating circuit comprising a series circuit having a first fixed capacitor connected in series with said crystal resonator and a diode; bias means for applying an inverse bias to said diode; a second temperature variable capacitor for intermediate temperature compensation connected in parallel to said high temperature compensating circuit; and a thermistor for applying a forward-bias temperature-dependent voltage to a connection point between said fixed capacitor and said diode.

5. In a temperature compensated crystal oscillator comprising an oscillator section having a crystal resonator and an amplifying element, and a temperature compensating section for compensating for a change in the oscillator frequency due to a temperature change of the oscillator section, the improvement wherein said temperature compensating section comprises: a low temperature compensating circuit connected in series with said crystal resonator and consisting of a first series circuit having a first fixed capacitor and a first diode; a high temperature compensating circuit connected in parallel with said low temperature compensating circuit and consisting of a second series circuit consisting of a second fixed capacitor and a second diode; bias means for applying an inverse bias voltage to said second diode in the low and intermediate temperature ranges; a third temperature variable capacitor for intermediate temperature compensation connected in parallel to said low temperature compensating circuit; and a thermistor for applying a forward-bias temperature dependent voltage to the connection points between said first and second capacitors and said first and second diodes, respectively.

6. A temperature compensated crystal oscillator as claimed in any of claims, 3, 4 or 5 wherein said capacitor for intermediate temperature compensation has a negative temperature coefficient.

* * * * *